United States Patent [19]

Fink

[11] Patent Number: 5,864,219

[45] Date of Patent: Jan. 26, 1999

[54] CIRCUIT FOR DETECTING A LEVEL OR A VARIATION OF AN INPUT DIRECT VOLTAGE

[75] Inventor: Helmut Fink, Graz, Austria

[73] Assignee: U.S. Phillips Corporation, New York, N.Y.

[21] Appl. No.: 808,593

[22] Filed: Feb. 28, 1997

[30] Foreign Application Priority Data

Mar. 1, 1996 [EP] European Pat. Off. .............. 96200544

[51] Int. Cl.⁶ ................................................. H01M 10/46
[52] U.S. Cl. ........................................................ 320/132
[58] Field of Search .................................... 302/125, 132, 302/134, 136, 139, 163, 147, 138, DIG. 21, 155

[56] References Cited

U.S. PATENT DOCUMENTS

| | | | |
|---|---|---|---|
| 4,153,867 | 5/1979 | Jungfer et al. | 320/DIG. 21 |
| 5,296,797 | 3/1994 | Bartlett | 320/145 |
| 5,313,208 | 5/1994 | Bellini | 341/166 |
| 5,570,382 | 10/1996 | Miyamoto . | |
| 5,598,085 | 1/1997 | Hasler | 320/145 |
| 5,642,027 | 6/1997 | Windes et al. | 320/166 |

FOREIGN PATENT DOCUMENTS

| | | |
|---|---|---|
| 0381217 | 8/1990 | European Pat. Off. . |
| 2719379 | 11/1995 | France . |

OTHER PUBLICATIONS

Patent Abstract of Japan, 8–23326 (Oki Electric Ind Co Ltd), 23 Jan. 1996.

*Primary Examiner*—Edward Tso
*Attorney, Agent, or Firm*—Steven B. Biren

[57] ABSTRACT

A circuit for detecting a level of an input direct voltage comprises a comparator for comparing the input direct voltage with a reference signal, which by means of an integrator is derived from pulses whose charge quantity is variable in dependence on a comparator direct voltage. The reference voltage has a d.c. component and an a.c. component. The comparator supplies comparator pulses of a given pulse duration when the d.c. component of the reference voltage is substantially equal to the input direct voltage. The level of the input direct voltage is determined from the charge quantity of the pulses and from the pulse duration of the comparator pulses.

20 Claims, 5 Drawing Sheets

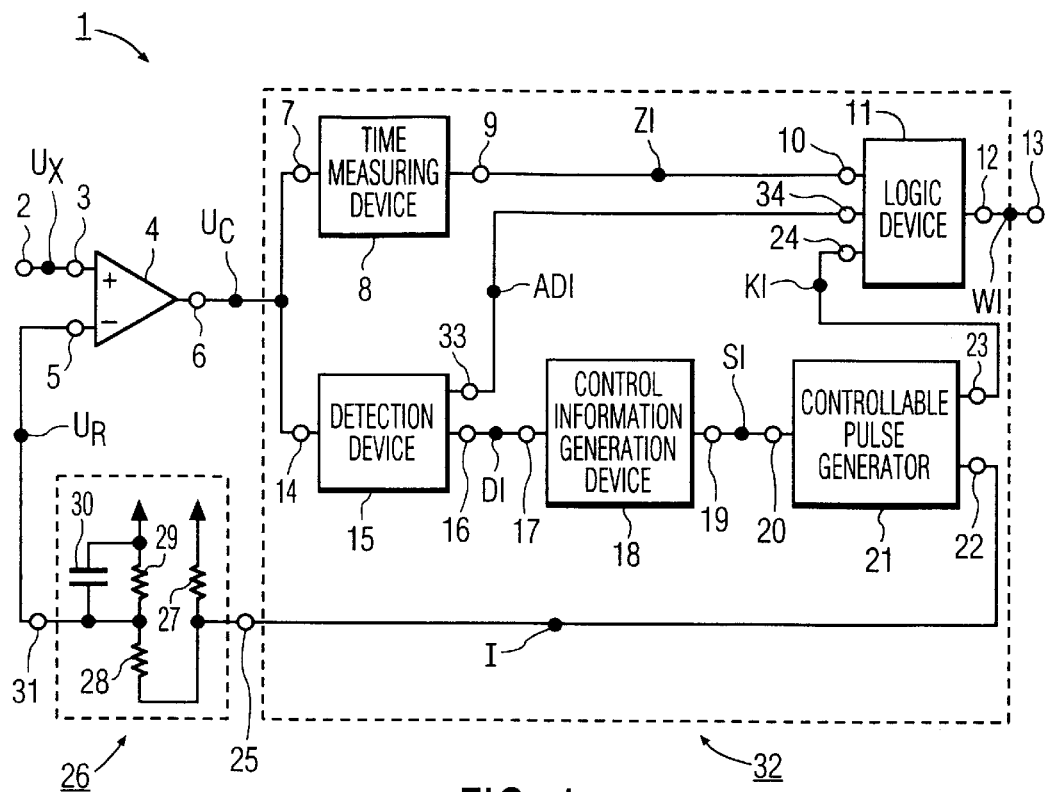
FIG. 1
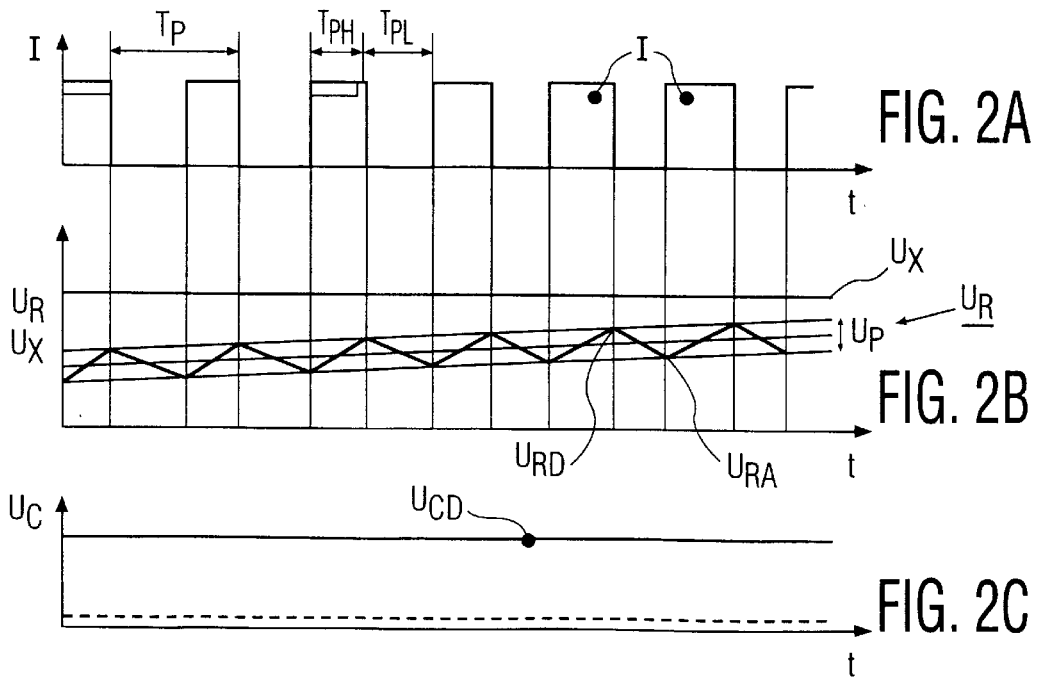
FIG. 2A
FIG. 2B
FIG. 2C

CIRCUIT FOR DETECTING A LEVEL OR A VARIATION OF AN INPUT DIRECT VOLTAGE

BACKGROUND OF THE INVENTION

1. Field of the Invention

The invention relates to a circuit for detecting a level or a level variation of an input direct voltage, comprising an input terminal, to which the input direct voltage can be applied, and comprising a comparator having a first input, a second input and an output, which first input is connected to the input terminal, which second input is arranged to receive a reference signal, and on which output a comparator signal is available, and comprising a control information generation device by means of which control information corresponding to the comparator signal of the comparator can be generated, and comprising a controllable pulse generator for generating pulses which are available on an output of the pulse generator and which are variable with respect to their charge quantity by means of the control information which corresponds to the comparator signal and which can be applied to the pulse generator by the control information generation device, and comprising an integrator having an input connected to the output of the pulse generator and having an output connected to the second input of the comparator and provided to form the reference signal with the aid of the pulses of the pulse generator, the reference signal having a d.c. component corresponding to the instantaneous charge quantity of the pulses of the pulse generator, and having an a.c. component superposed on the d.c. component.

2. Description of Related Art

Such a circuit of the type defined in the opening paragraph is, for example, known form EP 0 381 217 A2. In said known circuit a level or a level variation of an input direct voltage which can vary is effected merely on the basis of the value of the charge quantity of the pulses from the pulse generator, which charge quantity is determined by the duration of these pulses, as a result of which only a comparatively low resolution within a given range of levels or level variations to be detected is attainable, so that only a comparatively coarse detection of a level or level variation is possible. Moreover, the pulse generator in the known circuit does not operate continuously but intermittently during cyclically succeeding operating periods which are spaced from one another by pause intervals, which may give rise to undesirable transient effects at the beginning of each operating period. Furthermore, it is to be noted that in the known circuit a capacitor in the integrator is charged and subsequently discharged substantially completely in cyclic succession in dependence on the pulses of the pulse generator, so that residual charges left in the capacitor after discharging can have an adverse effect.

SUMMARY OF THE INVENTION

It is an object of the invention to preclude the aforementioned problems and to improve a circuit of the type defined in the opening paragraph in the simplest possible way. In is another object of the invention to ensure a very sensitive detection of a level or a level variation of an input direct voltage by means of such an improved circuit of the type defined in the opening paragraph. To achieve these objects, according to the invention, a circuit of the type defined in the opening paragraph is characterized in that the integrator is adapted to form a reference signal in which the frequency of the a.c. component corresponds to the frequency of the pulses of the pulse generator. The comparator has its output connected to a detection device by means of which the presence of a comparator direct voltage and the presence of comparator pulses can be detected. The control information generation device can be controlled in such a manner that, upon a detection of the presence of a comparator direct voltage, the control information for the pulse generator, for varying the charge quantity of the pulses of the pulse generator, can be generated. After a detection of the occurrence of comparator pulses, the generation of control information for the pulse generator can be terminated. The comparator further has its output connected to a time measuring device by means of which, after termination of the generation of the control information for the pulse generator, time information about the duration of the comparator pulses or the comparator pulse spacings can be derived. There is also provided a logic device which detects a level or a level variation of the input direct voltage after termination of the generation of the control information for the pulse generator. Characteristic information about the charge quantity of the pulses of the pulse generator, and time information about the duration of the comparator pulses or the comparator pulse spacings can be applied to said logic device. In a circuit in accordance with the invention, the detection of a level or a level variation of an input voltage which can vary is based on characteristic information about the charge quantity of the pulses of the pulse generator and on time information about the duration of the comparator pulses or the comparator pulse spacings. Because of the additionally processed time information, a very fine resolution within a given range of levels or level variations to be detected can be achieved, as a result of which a comparatively fine and accurate detection of a level or level variation is possible. Moreover, it is to be noted that in a circuit in accordance with the invention, the pulse generator is continuously active without interruptions and continually supplies pulses, so that no undesirable transient effects caused by cyclically recurring turn-on transients can occur. Furthermore, it is to be noted that in order to form the reference signal by means of the integrator, a circuit in accordance with the invention does not require a capacitor to be charged and subsequently discharged substantially completely in cyclic succession, which has the advantage that no adverse effects caused by such complete charging and discharging can occur.

In a circuit in accordance with the invention it has proved to be advantageous if the integrator is adapted to form a reference signal whose a.c. component is a sawtooth signal superposed on the d.c. component of the reference signal. In this way it is achieved that there is a linear relationship between the duration of the comparator pulses or the comparator pulse spacings, which is advantageous for a simple processing of the time information about the comparator pulses or the comparator pulse spacings in the detection of a level or level variation of an input direct voltage.

It has further proved to be advantageous if the detection device and the time measuring device are implemented by means of a single counting device. This is advantageous for a simple implementation, particularly if implementation is effected by means of a microcomputer.

In this respect it has proved to be particularly advantageous if the detection device and the control information generation device and the pulse generator and the time measuring device and the logic device are implemented by means of a microcomputer. This results in a particularly simple and inexpensive embodiment.

For a circuit in accordance with the invention, it has proved to be very advantageous if it forms part of a circuit arrangement for charging at least one rechargeable battery, and in this circuit arrangement, serves to detect a level or a level variation of the charging voltage appearing across the battery during a charging process. In such a configuration a circuit in accordance with the invention has proved to be particularly advantageous since it enables very small charging voltage variations to be detected.

In this respect it has proved to be particularly advantageous for a circuit in accordance with the invention if, in the circuit arrangement for charging, it serves to detect a decrease in level of the charging voltage. Thus, a circuit in accordance with the invention makes it possible to preclude undesirable overcharging of a rechargeable battery—which as is known gives rise to a decrease in charging voltage, which can be detected very accurately by means of the circuit in accordance with the invention.

The above-mentioned as well as further aspects of the invention will become apparent from the exemplary embodiments described hereinafter and will be elucidated by means of these exemplary embodiments.

BRIEF DESCRIPTION OF THE DRAWINGS

The invention will now be described in more detail with reference to the drawings, which show three exemplary embodiments to which the invention is not limited.

FIG. 1 shows diagrammatically a block diagram of a circuit in accordance with a first embodiment of the invention, in which the essential circuit elements have been implemented by means of a microcomputer.

FIGS. 2A–C show diagrams of first signal waveforms of signals on the output of a pulse generator, on the output if an integrator and on the output of a comparator of the circuit shown in FIG. 1.

DETAILED DESCRIPTION OF THE PREFERRED EMBODIMENTS

Figure 3:
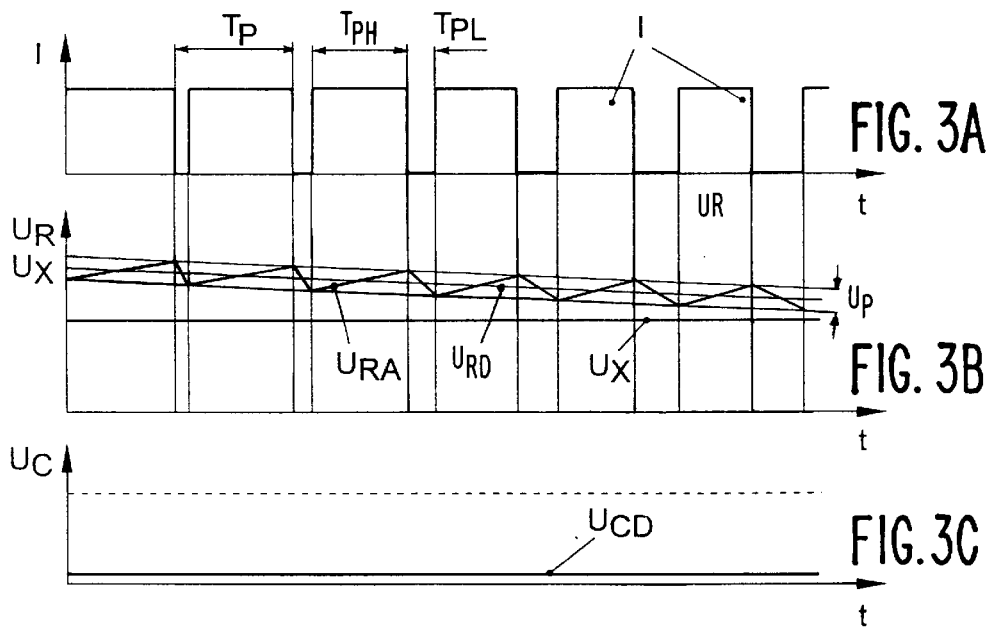
FIGS. 3A–C show diagrams of second signal waveforms of signals on the output of a pulse generator, on the output if an integrator and on the output of a comparator of the circuit shown in FIG. 1.

FIG. 1 shows a circuit I for detecting a level or a level variation of an input direct voltage $U_X$ which can vary. The circuit 1 has an input terminal 2, to which the input direct voltage $U_X$ can be applied. The input terminal 2 is connected to a first input 3 of a comparator 4, which input is arranged to receive the input direct voltage $U_X$. The comparator 4 further has an input 5, arranged to receive a reference signal $U_R$, which will be described in more detail hereinafter. The comparator 4 serves to compare the values of the input direct voltage $U_X$ and the reference signal $U_R$ and the comparator 4 has an output 6 on which the comparator 4 supplies a comparator signal $U_C$ which is dependent on the value of the input direct voltage $U_X$ and on the value of the reference signal $U_R$. As will be explained hereinafter, the comparator signal $U_C$ in the present case is formed either by one of two comparator direct voltages $U_{CD}$ which differ in level, or by comparator pulses $U_{CI}$.

A time measuring device 8 has an input 7 connected to the output 6 of the comparator 4 in order to apply the comparator signal $U_C$ supplied by the comparator 4 to the time measuring device 8. By means of the time measuring device 8 it is possible to generate time information ZI corresponding to the duration of the comparator signal $U_C$ applied to it. An output 9 of the time measuring device 8 is connected to a first input 10 of a logic device 11, so that the time information ZI determined by means of the time measuring device 8 can be applied to the logic device 11. By means of the logic device 11 it is possible to derive value information WI about the instantaneous value of a level or a level variation of the input direct voltage $U_X$. Value information WI about the instantaneous value of the level or the level variation of the input direct voltage $U_X$ detected by means the logic device 11 is available on an output 12 of the logic device 11, which output is connected to an output terminal 13 of the circuit 1.

The output 6 of the comparator 4 is further connected to an input 14 of a detection device 15 by means of which the presence of a comparator direct voltage $U_{CD}$ and the occurrence of comparator pulses $U_{CI}$ as a comparator signal $U_C$ on the output of the comparator 5 can be detected and by means of which detection information DI corresponding to the instantaneous detection result and hence to the instantaneous comparator signal $U_C$ can be generated. An output 26 of the detection device 15 is connected to an input 17 of a control information generation device 18, thus enabling the detection information DI detected by means of the detection device 15 to be applied to the control information generation device 18. By means of the control information generation device 18 it is possible to generate control information SI corresponding to the detection information DI applied to it and, consequently, to the instantaneous comparator signal $U_C$. The control information generation device 18 has an input 19 connected to an input 20 of a controllable pulse generator 21, as a result of which control information SI generated by means of the control information generation device 18 can be supplied to the pulse generator 21.

The pulse generator 21 serves for generating pulses I which can be varied with respect to their charge quantity by means of the control information SI which can be applied to the pulse generator 21 by the control information generation device 18 and which corresponds to the comparator signal $U_C$. In the present case the arrangement is such that, in order to change the charge quantity of the pulses I generated by means of the controllable pulse generator 21 their pulse duration can be varied while the frequency and the amplitude of the pulses I remains the same. However, to change the charge quantity of pulses generated by means of a controllable pulse generator, it is also possible to change the frequency of these pulse while the pulse duration and the amplitude remain the same or, alternatively, to change the amplitude of these pulses while the frequency and the pulse duration remain the same. In practice, the essentially constant frequency of the pulses I of variable pulse duration supplied by the pulse generator 21 of the circuit 1 in accordance with FIG. 1 is approximately 2.0 kHz.

The pulse generator 21 is further adapted to generate and supply characteristic information KI about the value of the instantaneous charge quantity, i.e. in the present case about the value of the instantaneous pulse duration of the pulses I generated by it.

The pulse generator 21 has a first output 22 and a second output 23. On the first output 22 the pulse generator 21 produces the variable-duration pulses I generated by it. On the second output 23 the pulse generator 21 supplies the characteristic information I about the instantaneous charge quantity, i.e. in the present case about the instantaneous pulse duration of the pulses I generated by it. The output 23 of the pulse generator 21 is connected to a second input 24 of the logic device 11. In this way the characteristic information KI produced on the second output of the pulse generator 21 can be applied to the logic device 11.

The pulse generator 21 has its first output 22 connected to an input 25 of an integrator 26. The integrator 26 comprises resistors 27, 28 and 29 and a capacitor 30. The pulses I from the pulse generator 21 can be applied to the integrator 26 via its input 25. The integrator 26 is adapted to generate the reference signal $U_R$ by means of the pulses I from the pulse generator 21. The integrator 26 forms the reference signal $U_R$ by integrating the pulses I applied to it and is of such a construction that the reference signal $U_R$ has a d.c. component $U_{RD}$ corresponding to the instantaneous charge quantity of the pulses I, i.e. the instantaneous pulse duration of the pulses I from the pulse generator 21, and an a.c. component $U_{RA}$ superposed on the d.c. component $U_{RD}$, the a.c. component $U_{RA}$ being formed by a substantially sawtooth-shaped signal and the frequency of the a.c. component $U_{RA}$ corresponding to the frequency of the pulses I from the pulse generator 21. The integrator 26 has an output 31 connected to the second input 5 of the comparator 4 to apply the reference signal $U_R$ to the second input 5 of the comparator 4.

It is to be noted that the comparator 4 is of such a construction that, in the case that the d.c. component $U_{RD}$ of the reference signal $U_R$ differs substantially from the input direct voltage $U_X$, it can generate as comparator signal $U_C$ a comparator direct voltage $U_{CD}$ which is dependent on the deviation of the d.c. component $U_{RD}$ from the input direct voltage $U_X$ and that in the case that the d.c. component $U_{RD}$ of the reference signal $U_R$ substantially corresponds to the input direct voltage $U_X$. It can also generate as comparator signal $U_C$ comparator pulses $U_{CI}$ which are dependent on the a.c. component $U_{RA}$ and, in the present case, on the variation of the a.c. component $U_{RA}$ of the reference signal $U_R$.

It is to be noted also that in the present circuit shown in FIG. 1 the time measuring device 8, the logic device 1, the detection device 15, the control information generation device 18 and the pulse generator 21 are implemented by means of a microcomputer indicated diagrammatically by means of the broken lines in FIG. 1.

The operation of the circuit shown in FIG. 1 will be described hereinafter with reference to FIGS. 2, 3 and 4.

An input direct voltage $U_X$ applied to the input terminal 2 of the circuit 1 is transferred to the first input 3 of the comparator 4. In response to this, the comparator 4 produces a comparator signal $U_C$ on its output 6. This comparator signal $U_C$ is dependent on the reference signal $U_R$ applied to the second input 5 of the comparator 4. In the embodiment shown in FIG. 1 the first input 3 of the comparator 4 is a non-inverting input and the second input 5 of the comparator 4 is an inverting input, so that the comparator signal $U_C$ assumes a low level L if the reference signal $U_R$ is continually larger than the input direct voltage $U_X$, and the comparator signal $U_C$ assumes a high level H if the reference signal $U_R$ is continually smaller than the input direct voltage $U_X$. In the two above-mentioned cases the comparator 4 produces on its output 6 a comparator signal $U_C$ in the form of a comparator direct voltage $U_{CD}$, which has a low level L in said first case and a high level H in said second case. If the d.c. component $U_{RD}$ of the reference signal $U_R$ substantially corresponds to the input direct voltage $U_X$ and, as a consequence, the a.c. component $U_{RA}$ of the reference signal $U_R$ fluctuates about the input direct voltage $U_X$, the comparator signal $U_C$ alternately assumes the high level and the low level in accordance with the alternation of the a.c. component $U_{RA}$, so that comparator pulses $U_{CI}$ appear as the comparator signal $U_C$ on the output 6 of the comparator 4.

The instantaneous comparator signal $U_C$ is applied to the detection device 15, which detects the presence of a comparator direct voltage $U_{CD}$ with a low level, or the presence of a comparator direct voltage $U_{CD}$ with a high level, or the occurrence of comparator pulses $U_{CI}$ and which derives and supplies detection information DI corresponding to the instantaneous detection result. The instantaneous detection information DI is applied to the control information generation device 18, which is responsive to the detection information DI to generate control information SI, which is used for controlling the pulse generator 21. When the input direct voltage $U_X$ deviates considerably from the reference signal $U_R$ the comparator 4 produces a comparator direct voltage $U_{CD}$ on its output 6. As long as the detection device 15 detects the presence of a comparator direct voltage $U_{CD}$ it supplies detection information DI to the control information generation device 18 such that the control information generation device 18 generates and supplies control information SI, which causes the pulses I generated in the pulse generator 21 to be modified as regards their charge quantity, which is effected by changing the pulse duration of the pulses I. In the case of the circuit shown in FIG. 1, in which the pulse generator 21 is realized by means of a microcomputer 32, changing of the pulse duration of the pulses I in order to change the charge quantity of the pulses I can be implemented in a particularly simple manner. It is to be noted that the change of the pulse duration of the pulses I from the pulse generator 21 corresponds to a change of the duty cycle of the pulse train supplied by the pulse generator 21.

In response to the afore-mentioned control information SI the pulse generator 21 changes the pulse width of the pulses I generated by this generator, which pulses are applied to the input 25 of the integrator 26. The integrator 26 is designed in such a manner that the capacitor 30 is charged when the high level of the pulses I from the pulse generator 21 occurs and the capacitor 30 is discharged when the low level of the pulses I from the pulse generator 21 occurs. In this way it is achieved that the frequency of the a.c. component $U_{RA}$ of the reference signal $U_R$ produced on the output 31 of the integrator 26 corresponds to the frequency of the pulses I from the pulse generator 21. Moreover, the frequency of the pulses from the pulse generator 21 is selected in such a manner that the capacitor 30 is not fully charged when the high level of the pulses I occurs and the capacitor 30 is not fully discharged when the low level of the pulses I occurs.

When, during a time interval, pulses I have been applied from the pulse generator 21 to the integrator 26 with the same charge quantity, i.e. with the same pulse duration or pulse width, a reference signal $U_R$ is obtained on the output 31 of the integrator 26. This reference signal $U_R$ comprises a d.c. component $U_{RD}$ of a given value and an a.c. component $U_{RA}$ of a given value, superposed on the d.c. component $U_{RD}$. If the charge quantity, i.e. the pulse duration of the pulses I supplied to the integrator 26 by the pulse generator 21, is increased the value of the d.c. component $U_{RD}$ of the reference signal $U_R$, on which the a.c. component $U_{RA}$ is superposed, increases. Conversely, if the charge quantity, is reduced, the value of the d.c. component $U_{RD}$ of the reference signal $U_R$, decreases. Consequently, by varying the charge quantity, i.e. the pulse duration of the pulses I supplied to the integrator 26 by the pulse generator 21, the d.c. component $U_{RD}$ of the reference signal $U_R$ can be varied over a wide range, corresponding to the measurement range of the circuit I for detecting the level or level variation of an input direct voltage $U_X$.

When the detection information DI from the detection device 15 of the control information generation device 18 indicates the occurrence of a comparator direct voltage $U_{CD}$ having a high level as shown in part C of FIG. 2, which means that the reference signal $U_R$ altogether has a lower level than the input direct voltage $U_X$, as is shown in part B of FIG. 2, the control information generation device 18 supplies control information SI for the stepwise increase of the charge quantity, i.e. the pulse duration $T_{PH}$ of the pulses I from the pulse generator 21, which pulses I are shown in part A of FIG. 2. The increased charge quantity of the pulses I from the pulse generator 21 then causes the d.c. component $U_{RD}$ of the reference signal $U_R$ to increase, as a result of which the reference signal $U_R$ approximates step by step to the input direct voltage $U_X$.

When the detection information DI from the detection device 15 of the control information generation device 18 indicates the occurrence of a comparator direct voltage $U_{CD}$ having a low level as shown in part C of FIG. 3, which means that the reference signal $U_R$ altogether has a higher level than the input direct voltage $U_X$, as is shown in part B of FIG. 3, the control information generation device 18 supplies control information SI for the step-by-step reduction of the charge quantity, i.e. the pulse duration $T_{PH}$ of the pulses I from the pulse generator 21, which pulses I being shown in part A of FIG. 3. The reduced charge quantity of the pulses I from the pulse generator 21 then causes the d.c. component $U_{RD}$ of the reference signal $U_R$ to decrease, so that also in this case the reference signal $U_R$ approximates step by step to the input direct voltage $U_X$.

Figure 4:
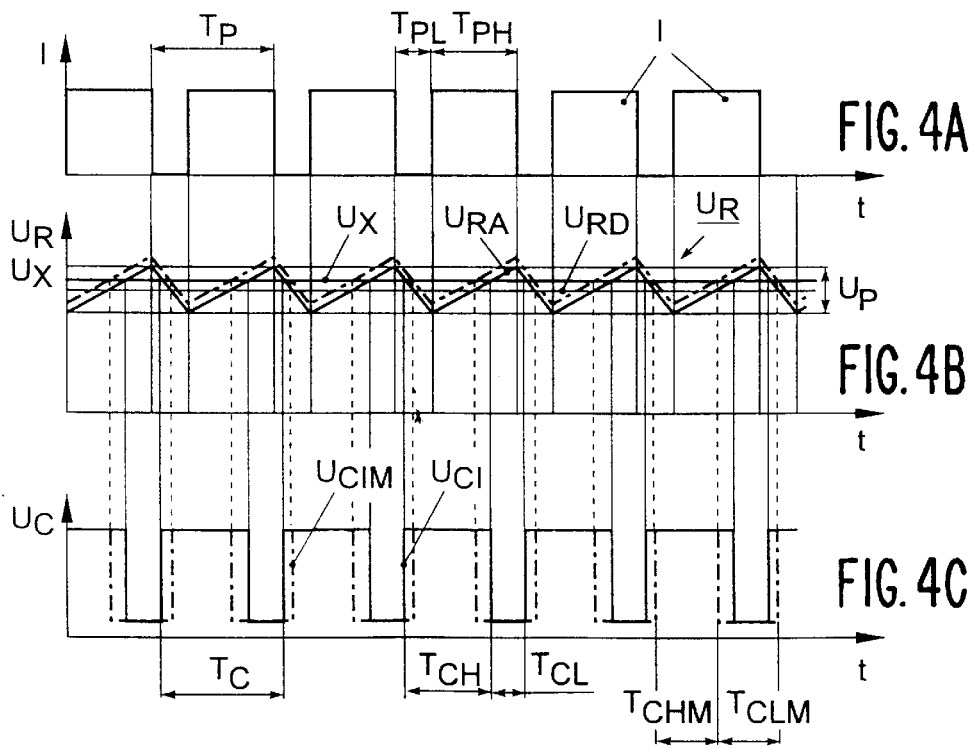
FIG. 4A–C show diagrams of third signal waveforms of signals on the output of a pulse generator, on the output if an integrator and on the output of a comparator of the circuit shown in FIG. 1.

In the manner described in the foregoing the stepwise variation of the pulse duration or pulse width $T_{PH}$ of the pulses I from the pulse generator 21 causes the d.c. component $U_{RD}$ of the reference signal $U_R$ to be changed until the value of the d.c. component $U_{RD}$ of the reference signal $U_R$ and the value of the input direct voltage $U_X$ only differ or deviate a little from one another, as is shown in part B of FIG. 4. In this case the a.c. component $U_{RA}$ superposed on the d.c. component $U_{RD}$ of the reference signal $U_R$ fluctuates about the input direct voltage $U_X$ within a level-variation range $U_P$. Comparator pulses $U_{CI}$ as shown in part C of FIG. 4 then appear on the output 6 of the comparator 4. As can be seen, the comparator pulses $U_{CI}$ have a pulse duration $T_{CH}$ and the comparator pulses $U_{CI}$ are separated from one another by pulse spacings of a duration $T_{CL}$. The sum of the pulse duration $T_{CH}$ and the duration $T_{CL}$ of the pulse spacing yields the period $T_C$ of the train of comparator pulses $U_{CI}$ appearing on the output 6 of the comparator 4. The occurrence of comparator pulses $U_{CI}$ as the comparator signal $U_C$ is detected by means of the detection device 15.

Since the d.c. component $U_{RD}$ of the reference signal $U_R$ is always given by the pulse duration $T_{PH}$ of the pulses I from the pulse generator 21, the pulse duration $T_{PH}$ during said occurrence of comparator pulses $U_{CI}$ corresponds to a value of the d.c. component $U_{RD}$ which very closely approximates to the value of the input direct voltage $U_X$.

After the d.c. component $U_{RD}$ has reached its value which very closely approximates to the value of the input direct voltage $U_X$ and the detection device 15 has detected the occurrence of comparator pulses $U_{CI}$, the detection device 15 supplies detection information DI to the control information generation device 18 via its output 16, as a result of which in the control information generation device 18 the generation of control information SI, to be supplied to the pulse generator 21 in order to change the pulse duration $T_{PH}$ of the pulses I of the pulse generator 21, is terminated or inhibited. Furthermore, the detection device 15 then produces further detection information ADI on a further output 33, which information is transferred to a further input 34 of the logic device 11 and as a result of which the characteristic information KI about the value of the pulse duration $T_{PH}$ defined in the pulse generator 21 is used for processing in the logic device 11, which characteristic information is applied from the pulse generator 21 to the input 24 of the logic device 11 after reception of the further detection information ADI. By means of this processing of the characteristic information KI about the value of the pulse duration $T_{PH}$, which processing is effected by comparison of the characteristic information KI with stored nominal values, the value of the d.c. component $U_{RD}$ is determined, which value lies already very close to the value of the input direct voltage $U_X$. In this way the level of the input direct voltage $U_X$ has already been determined coarsely or approximately.

Since, the duration $T_{CH}$ of the comparator pulses $U_{CI}$ has now also been determined by means of the time measuring device 8, time information ZI about this duration $T_{CH}$ is now also obtained. This time information ZI corresponds to the difference between the value of the d.c. component $U_{RD}$, which already lies very close to the value of the input direct voltage $U_X$, and the input direct voltage $U_X$, as will be explained below with reference to FIG. 4, so that the value of the level of the input direct voltage $U_X$ can be determined accurately by determining and processing this time information ZI. Said time information ZI is applied to the logic device 11 from the time measuring device 8 via the output 9 of this device and via the input 10 of the logic device 11, after which the logic device 11 exactly determines the level or level variation of the input direct voltage $U_X$ on the basis of the characteristic information KI about the pulse duration $T_{PH}$ and said time information ZI.

FIG. 2 shows first signal waveforms of signals on the output 22 of the pulse generator 21, on the output 31 of the integrator 26 and on the output 6 of the comparator 4. Part A of FIG. 2 shows a pulse train comprising pulses I from the pulse generator 21, whose period $T_P$ is made up of the duration $T_{PH}$ of the pulses I and of the duration $T_{PL}$ of the pulse spacings. The pulse train shown in part A in FIG. 2 has a duty cycle of $T_{PH}:T_{PL}$, the pulse duration $T_{PH}$, which determines the charge quantity of the pulses I, being comparatively short and being equal to 40% of the period $T_P$. Part B of FIG. 2 shows an input direct voltage $U_X$ applied to the input terminal 2 and a reference signal $U_R$ having a d.c. component $U_{RD}$ and an a.c. component $U_{RA}$, which a.c. component $U_{RA}$ varies within a level-variation range $U_P$. This reference signal $U_R$ is obtained by means of the integrator 26, which integrates the pulses I as shown in part A of FIG. 2.

Part C in FIG. 2 shows a comparator signal $U_C$, which is obtained by comparison of the input direct voltage $U_X$ shown in part B of FIG. 2 and the reference signal $U_R$ and which is a comparator direct voltage $U_{CD}$ having a high level. This is because the d.c. component $U_{RD}$ of the reference signal $U_R$ deviates substantially from the input direct voltage $U_X$, i.e. is substantially smaller, and the input direct voltage $U_X$ consequently lies outside the level-variation range $U_P$.

The comparator signal $U_C$ shown in part C of FIG. 2 is detected by means of the detection device 15, the detection device 15 generating corresponding detection information DI and supplying this information to the control information generation device 18. In response to this, the control information generation device 18 generates control information SI, which it applies to the pulse generator 21 in order to increase the duty cycle of the pulse train comprising the pulses I, i.e. in order to increase the pulse duration $T_{PH}$ of the pulses I of the pulse generator 21. As a result of the increased pulse duration $T_{PH}$ the d.c. component $U_{RD}$ of the reference signal $U_R$ is increased. This process of increasing the pulse duration $T_{PH}$ and, as a consequence, increasing the d.c. component $U_{RD}$ of the reference signal $U_R$ is repeated until the value of the d.c. component $U_{RD}$ very closely approximates to the input direct voltage $U_X$, as is shown in part B of FIG. 4.

FIG. 3 shows second signal waveforms of signals on the output 22 of the pulse generator 21, on the output 31 of the integrator 26 and on the output 6 of the comparator 4. Part A of FIG. 3 shows a pulse train comprising further pulses I from the pulse generator 21 and having a duty cycle of $T_{PH}:T_{PL} = 90:10$, the pulse duration $T_{PH}$, which determines the charge quantity of these further pulses I, being comparatively long and being equal to 90% of the period $T_P$. When these further pulses I are applied to the input 25 of the integrator 26, the capacitor 30 is charged during the comparatively long duration $T_{PH}$ of the pulses and is discharged during the only comparatively short duration $T_{PL}$ of the pulse spacings, so that the reference signal $U_R$ shown in Part B of FIG. 3 has a larger d.c. component than the reference signal $U_R$ shown in part B of FIG. 2. Moreover, the a.c. component $U_{RA}$ of the reference signal $U_R$ shown in art B in FIG. 3 has another amplitude than the a.c. component $U_{RA}$ shown in part B of FIG. 2, so that also another level-variation range $U_P$ of this a.c. component $U_{RA}$ is obtained. Part B of FIG. 3 further shows an input direct voltage $U_X$ smaller than the complete reference signal $U_R$.

Part C in FIG. 2 shows a comparator signal $U_C$, which is obtained by comparison of the input direct voltage $U_X$ shown in part B of FIG. 3 and the reference signal $U_R$ and which is a comparator direct voltage $U_{CD}$ with a low level. This is because the d.c. component $U_{RD}$ of the reference signal $U_R$ deviates substantially from the input direct voltage $U_X$, i.e. is substantially larger, and the input direct voltage $U_X$ consequently lies outside the level-variation range $U_P$.

The comparator signal $U_C$ shown in part C of FIG. 3 is detected by means of the detection device 15, the detection device 15 generating corresponding detection information DI and supplying this information to the control information generation device 18. In response to this, the control information generation device 18 generates control information SI, which it applies to the pulse generator 21 in order to reduce the duty cycle of the pulse train comprising the pulses I, i.e. in order to reduce the pulse duration $T_{PH}$ of the pulses I of the pulse generator 21. As a result of the reduction of the pulse duration $T_{PH}$ the d.c. component $U_{RD}$ of the reference signal $U_R$ is reduced. This process of reducing the pulse duration $T_{PH}$ and, as a consequence, reducing the d.c. component $U_{RD}$ of the reference signal $U_R$ is repeated until the value of the d.c. component $U_{RD}$ very closely approximates to the input direct voltage $U_X$, as is shown in part B of FIG. 4.

FIG. 4 shows third signal waveforms of signals on the output 22 of the pulse generator 21, on the output 31 of the integrator 26 and on the output 6 of the comparator 4. Part A of FIG. 4 shows a pulse train comprising further pulses I of the pulse generator 21 and having a duty cycle of $T_{PH}:T_{PL} = 70:30$, the pulse duration $T_{PH}$, which determines the charge quantity of these further pulses I, being equal to 70% of the period $T_P$.

It is assumed that for this duty cycle, or the corresponding pulse duration $T_{PH}$ of the pulses I, an input direct voltage $U_X$ shown in part B of FIG. 4 varies within a level-variation range $U_P$, in which the a.c. component $U_{RA}$ of a reference signal $U_R$ varies, which reference signal comprises a d.c. component $U_{RD}$ of the reference signal $U_R$ and an a.c. component $U_{RA}$. The value of said d.c. component $U_{RD}$ already lies very close to the value of the input direct voltage $U_X$, so that the a.c. component $U_{RA}$ fluctuates about the input direct voltage $U_X$ within the level-variation range $U_P$. As a result of this, comparator pulses $U_{CI}$ as shown in part C of FIG. 4 are supplied by the comparator 4. The comparator pulses $U_{CI}$ have a pulse duration $T_{CH}$ and are separated from one another by pulse spacings of a duration $T_{CL}$. The sum of the pulse duration $T_{CH}$ and the duration $T_{CL}$ of the pulse spacing yields a period $T_C$ of the train of comparator pulses. The period $T_C$ of the train of comparator pulses $U_{CI}$ always corresponds to the period $T_P$ of the pulse trains of pulses I of the pulse generator 21.

If as a result of the above-mentioned stepwise variation of the pulse duration $T_{PH}$ of the pulses I from the pulse generator 21 the value of the d.c. component $U_{RD}$ of the reference signal $U_R$ would have become exactly equal to the value of the input direct voltage $U_X$, the a.c. component $U_{RA}$ of the reference signal $U_R$ would be as indicated in dash-dot lines in part B of FIG. 4. On the output 6 of the comparator 4 this would result in comparator pulses $U_{CIM}$ as shown in dash-dot lines in part C of FIG. 4, having a pulse duration $T_{CHM}$ equal to the duration $T_{CLM}$ of the pulse spacings, so that the comparator pulse train supplied by the comparator 4 would have a duty cycle of $T_{CHM}:T_{CLM} = 50:50$. This duty cycle of $T_{CHM}:T_{CLM} = 50:50$ and, as a consequence, the associated pulse duration $T_{CHM}$ provide information that the value of the d.c. component $U_{RD}$ of the reference signal $U_R$ corresponds to the value of the input direct voltage $U_X$. Since in the present circuit, owing to the selection of a given frequency of the pulses I of the pulse generator 21, the period $T_p$ and hence the equal period $T_C$ are eventually known in the logic device 11, the pulse duration $T_{CHM}$ in the case of a duty cycle of $T_{CHM}:T_{CLM} = 50:50$ of the train of comparator pulses is also known. It is to be noted once again that this pulse duration $T_{CHM}$ provides information that the value of the d.c. component $U_{RD}$ of the reference signal $U_R$ corresponds to the value of the input direct voltage $U_X$.

If as a result of the above-mentioned stepwise variation of the pulse duration $T_{PH}$ of the pulses I from the pulse generator 21 the value of the d.c. component $U_{RD}$ of the reference signal $U_R$ has not become exactly equal to the value of the input direct voltage $U_X$, as is usually the case, the a.c. component $U_{RA}$ of the reference signal $U_R$ will be as indicated in solid lines in part B of FIG. 4, resulting in the comparator pulses $U_{CI}$ shown in solid lines in part C of FIG. 4. These comparator pulses have a pulse duration $T_{CH}$ which deviates from the value $T_{CHM}$, corresponding to the deviation of the input direct voltage $U_X$ from the d.c. component $U_{RD}$. Owing to the substantially linear edges of the sawtooth-shaped a.c. component $U_{RA}$ the advantage is obtained that there is a linear relationship between, on the one hand, said deviation of the input direct voltage $U_X$ from the d.c. component $U_{RD}$ and, on the other hand, the deviation of the value of the pulse duration $T_{CH}$ from the value of the pulse duration $T_{CHM}$. Therefore, the deviation of the value of the input direct voltage $U_X$ from value of the d.c. component $U_{RD}$, which is already known in the logic device, can be determined by determining the value of the pulse duration $T_{CH}$ or its deviation from the value $T_{CHM}$.

Therefore, time information ZI representing the pulse duration $T_{CH}$ is derived by means of the time measuring device 8 and is applied to the logic device 11. By comparing the derived time information ZI with stored nominal value the logic device 11 determines the deviation of the value of the input direct voltage $U_X$ from the known value of the d.c. component $U_{RD}$. Finally, the value of the input direct voltage $U_X$ is determined exactly by adding or subtracting the deviation of the value of the input direct voltage $U_X$ from the known value of the d.c. component $U_{RD}$ of the reference signal $U_R$, which has been determined by processing said time information ZI. After the value of the input direct voltage $U_X$ has been determined exactly by means of the logic device 11, the logic device 11 produces on its output 12 value information W1 about the value of the input direct voltage $U_X$. This value information W1 is available on the output terminal 13 of the circuit 1 for further processing. It is also possible to store the value information W1 about the value of the input direct voltage $U_X$ in the logic device 11 and to compare subsequently determined new value information WI about the input direct voltage $U_X$ with the previously determined and stored value information WI, and to derive from this comparison information about a level variation of the input direct voltage $U_X$.

It is to be noted that it is not strictly necessary to determine the deviation of an input direct voltage $U_X$ from a d.c. component $U_{RD}$ which already closely approximates this input direct voltage $U_X$ by means of the duration $T_{CH}$ of the comparator pulses $U_{CI}$ but can also be effected by means of the duration $T_{CL}$ of the comparator pulse spacings, because the duration $T_{CL}$ of the comparator pulse spacings is also a measure of said deviation.

It is to be noted also that the characteristic information KI, which represents the pulse duration $T_{CH}$ to which the pulse generator 21 has been set, need not necessarily be applied to the logic device 11 from the pulse generator 21 but can also be applied from the control information generation device 18.

Furthermore, it is to be noted that an input terminal arranged to receive an input direct voltage $U_X$ can also be connected to the inverting input of a comparator and the output of an integrator can also be connected to the non-inverting input of this comparator, in which case the signal waveforms are inverted.

Figure 5:
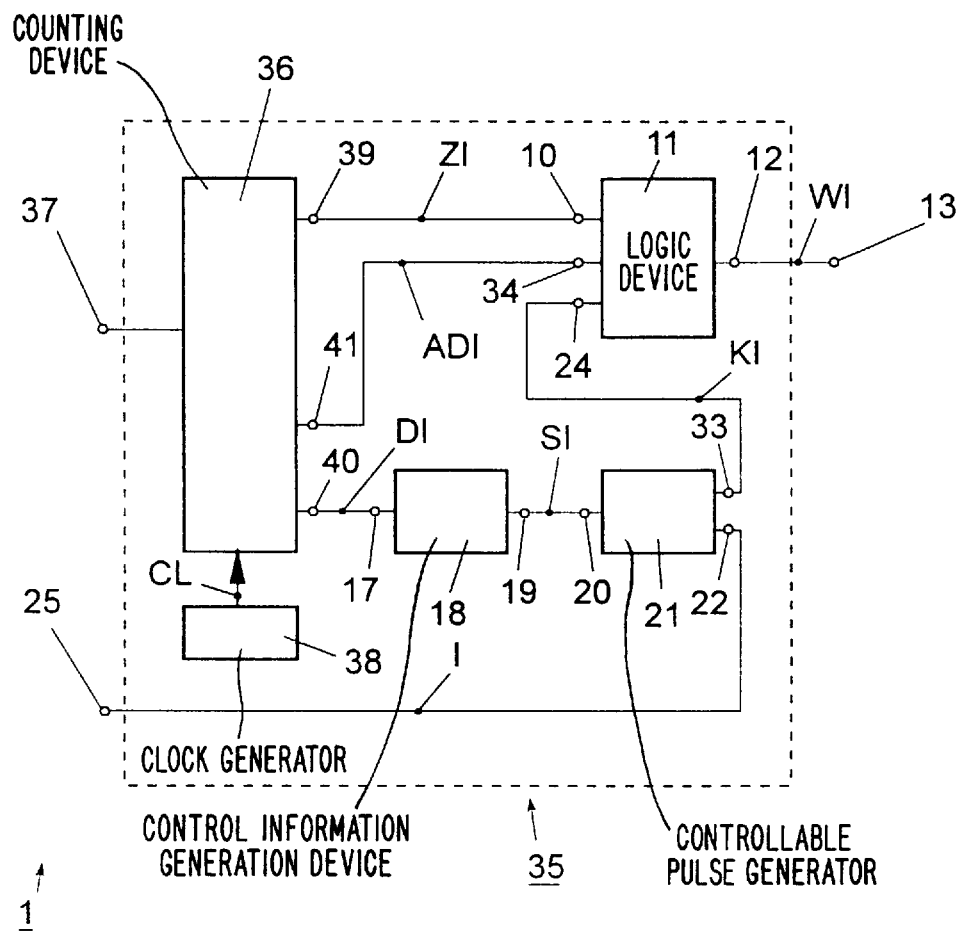
FIG. 5, similarly to FIG. 1, shows a part of a circuit in accordance with a second embodiment of the invention, in which a detection device and a time-measuring device are formed by a counting device.

FIG. 5 shows only a part of a circuit for detecting the level or level variation of an input direct voltage in accordance with a second embodiment. This circuit part is implemented by means of a microcomputer 35. In the circuit shown in FIG. 5 a detection device and a time measuring device are formed by means of a single counting device 36. The counting device 36 has an input 37 connected to the output of a comparator, not shown. The counting device 36 is arranged to receive clock pulses CL from a clock generator 38, which correspond to the internal clock pulses of the microcomputer 35. By counting the clock pulses CL the counting device 36 both detects the instantaneous comparator signal $U_C$ and measures the pulse duration $T_{CH}$ of the comparator pulses $U_{CI}$.

The counting device 36 has a first output 39 connected to the first input of the logic device 11. The counting device 36 has a second output 40 connected to the input 17 of the control information generation device 18. The counting device 36 has a third output 41 connected to the further input 34 of the logic device 11.

A program executed in the counting device 36, in order to perform the functions of a time measuring device and a detection device, will be described hereinafter with reference to a flow chart 42 shown in FIG. 6.

The program in the counting device 36 starts in a block 43, which program is carried out in order to detect a comparator direct voltage $U_{CD}$ with a high level or a comparator direct voltage $U_{CD}$ with a low level or to determine the pulse duration $T_{CH}$ of comparator pulses $U_{CI}$. Said comparator pulses $U_{CD}$ and $U_{CI}$ are applied to the input 37 of the counting device 36. In a subsequent block 44 a first counter $C_1$ and a second counter $C_2$ are each loaded with the value "0". In a block 45, which follows the block 44, it is checked whether a clock pulse CL from the clock generator 38, which can be applied to the counting device 36, has appeared. When this is not the case, the program remains in block 45. However, when a clock pulse CL from the clock generator 38 is detected, the program proceeds to a block 46. In the block 46 it is checked whether the comparator signal $U_C$ at the input 37 of the counting device 36 has a high level H. If the comparator signal $U_C$ has a high level H, the count of the first counter $C_1$ is incremented by "1" in a subsequent block 47 and subsequently the program proceeds to a following block 48. However, if the comparator signal $U_C$ does not have a high level, the program proceeds directly from block 46 to block 48. In block 48 it is checked whether the count of the second counter $C_2$ has already reached the value of a constant C, the constant C being equal to the ratio between the period $T_C$ of the comparator pulses $U_{CI}$ and the period of the clock pulses CL. If the check in block 48 is negative, the count of the second counter $C_2$ is incremented by "1" in a block 49 and subsequently the program proceeds to block 45. However, if the check in block 48 is positive, i.e. when the count of the second counter $C_2$ has reached the value of the constant C and, consequently, a time interval corresponding to the period $T_C$ has expired since the start of the program, the program proceeds to a subsequent block 50. In block 50 it is checked whether the count of the first counter $C_1$, whose value is equivalent to how long the comparator signal $U_C$ has had a high level within the period $T_C$, has the value "0". When the count of the first counter $C_1$ has the value "0", which means that the comparator signal $U_C$ has never assumed a high level in the period $T_C$, the program proceeds to a block 51. In block 51 detection information DI is generated, which information indicates that the comparator signal $U_C$ is a comparator direct voltage $U_{CL}$ with a low level L and is available at the output 40 of the counting device 36. If in block 50 the count of the first counter $C_1$ is found not to be "0", the program proceeds to a block 52. In block 52 it is checked whether the count of the first counter $C_1$ has reached the value of the constant C, which means that the comparator signal $U_C$ has assumed a high level H throughout the period $T_C$. If this is the case, the program proceeds to a block 53. In block 53 detection information DI is generated, which information indicates that the comparator signal $U_C$ is a comparator direct voltage $U_{CH}$ with a high level H and is available at the output 40 of the counting device 36. However, when it is found in block 52 that the count of the first counter $C_1$ has not reached the value of the constant C, the program proceeds to a block 54. Since in blocks 50 and 52 the count of the first counter $C_1$ was neither found to have the value "0" nor the value of the constant C, this means that the comparator signal $U_C$ has temporarily assumed a high level H and temporarily a low level L within the period $T_C$. Therefore, detection information DI is generated in block 54 to indicate that comparator pulses $U_{CI}$ have appeared as the comparator signal $U_C$, and is available at the output 40 of the counting device 36 and which, in the control information generation device 18, causes the termination of the control information SI, which is otherwise applied to the pulse generator 21 to change the pulse duration $T_{PH}$ of the pulses I of the pulse generator 21. Subsequently, further detection information ADI is generated in a further block 55, which information is available at the output 41 of the counting device 36 and as a result of which, in the logic device 11, the characteristic information KI about the value of the pulse duration $T_{PH}$ set in the pulse generator 21, is used for processing.

Subsequently, time information ZI is generated in a further block 56, which information is a measure of the pulse duration $T_{CH}$ of the comparator pulses $U_{CI}$ and is calculated in accordance with the equation $T_{CH}=[T_C \times Z(C_1)]/C$, where $T_C$, is the period of the comparator pulses $U_{CI}$, $Z(C_1)$ is the count of the first counter $C_1$, and C is the aforementioned constant. The calculated time information ZI is available at the output 39 of the counting device 36.

The program is stopped in a block 57 after one of the three possible forms of detection information DI, the further detection information ADI and the time information ZI have been supplied to the outputs 40, 41 and 39 of the time measuring device 36. The program described above in accordance with the flow chart 42 in FIG. 6 can be re-started in block 43 immediately after it has been terminated in block 57, in order to continually obtain detection information DI, further detection information ADI and time information ZI, but it may also be re-started after expiry of a given time interval.

Figure 6:
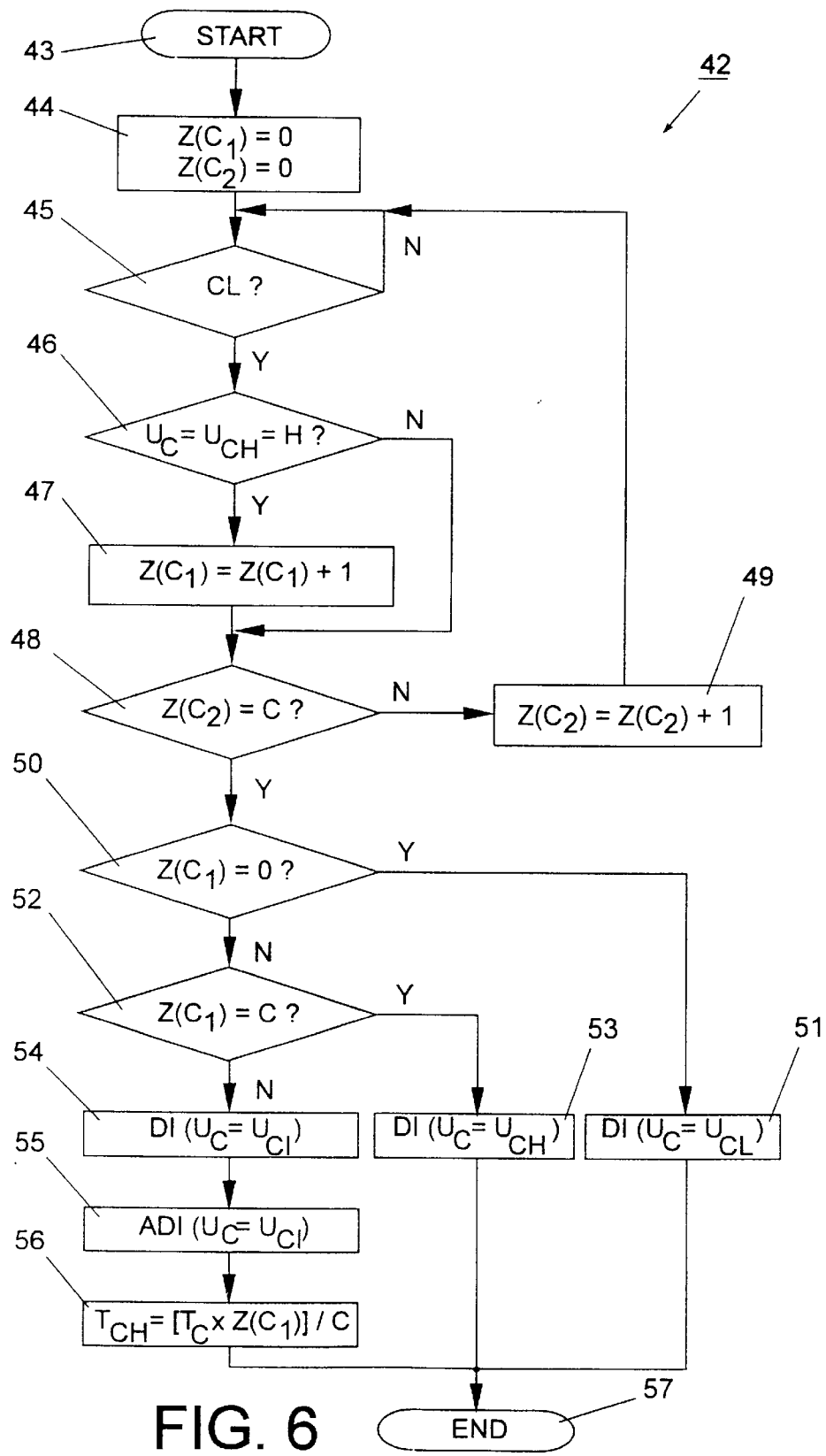
FIG. 6 is a flow chart of a program performed in the counting device shown in FIG. 5.

The program described with reference to the flow chart 42 shown in FIG. 6 is a possible variant for the implementation of a detection device and a time measuring device by means of a single counting device in a circuit for detecting a level or level variation of an input direct voltage, but such a circuit is not limited to this specific variant.

Figure 7:
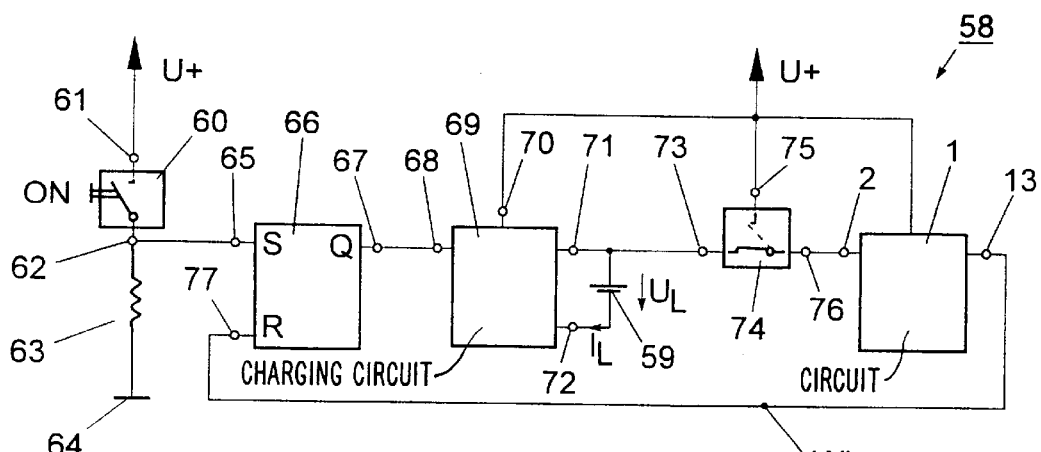
FIG. 7 is a block diagram which diagrammatically shows a circuit arrangement for charging a rechargeable battery, a circuit in accordance with the invention forming part of the circuit arrangement.

FIG. 7 shows diagrammatically a circuit arrangement 58 for charging a rechargeable battery 59. The circuit arrangement 58 may also be adapted to charge more than one battery at a time, for example two, three or more batteries. The circuit arrangement 58 includes a circuit 1, which is shown only diagrammatically as a block, for detecting a level variation, i.e. a level variation of the charging voltage $U_L$ appearing across the battery 59 during a charging process. The circuit arrangement 58 comprises a switch 60 having a first terminal 61 connected to a supply voltage U+ and having a second terminal 62 connected to as resistor 63, which resistor is connected to a ground terminal 64. The second terminal 62 of the switch 60 is connected to an S input 65 of a flip-flop 66. The flip-flop 66 has a Q output 67 connected to an input 68 of a charging circuit 69, which has an input 70 connected to the supply voltage U+. The battery 59 is connected to two terminals 71 and 72 of the charging circuit 69, across which a charging voltage $U_L$ appears during a charging process, which voltage is shown diagrammatically in FIG. 8. The terminal 72 is connected to ground in a manner not shown.

In addition, the terminal 71 of the charging circuit 69 is connected to an input 73 of a switch 74. The switch 74 has a further input 75, connected to the supply voltage U+, and an output 76, connected to the input terminal 2 of the circuit 1. When the switch 74 is in a first switch position shown as a solid line in FIG. 7, the switch 74 connects its input 73 to its output 76. When the switch 74 is in a second switch position shown in broken lines in FIG. 7, the switch 74 connects its further input 75 to its output 76. The output terminal 13 of the circuit 1 is then connected to an R input 77 of the flip-flop 66.

Figure 9:
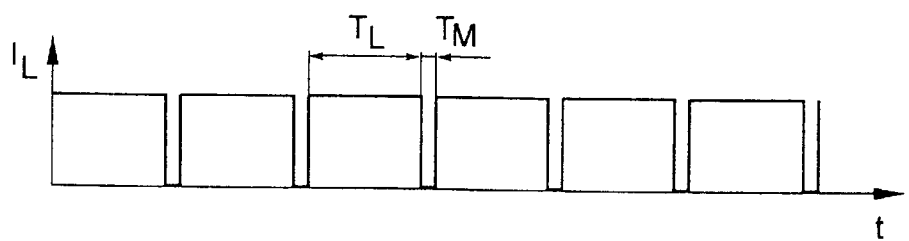
FIG. 9 represents a charging current applied to a battery by the circuit arrangement of FIG. 7 to charge this battery.

A charging process for charging the battery 59 is initiated by actuating the switch 60, as a result of which a current flows via the switch 60 and the resistor 63. Owing to the resulting voltage drop across the resistor 63 the S input 65 of the flip-flop 66 is at a high potential, as a result of which the flip-flop 66 is set and also produces a high potential on the Q output 67 until the flip-flop 66 detects a high potential on the R input and is consequently reset. Owing to the high potential on the output 67 of the flip-flop 66 the input 68 of the charging circuit 69, which input is connected to the output 67, is also at a high potential, which initiates the generation and supply of a charging current $I_L$, which flows from the terminal 71 of the charging circuit 69 to the terminal 72 of the charging circuit 69 via the battery 59 and which is shown in FIG. 9. As is shown in said Figure, this current is a pulse-shaped charging current $I_L$, by which the battery 59 is charged in the time intervals $T_L$ whereas no charging of the battery 59 is effected in the time interval $T_M$.

In the above-mentioned time intervals $T_M$ the switch 74 is set to its first switch position, in which the battery contact connected to the terminal 71 of the charging circuit 69 is connected to the input 73 of the switch 74 and, as a consequence, the charging voltage $U_L$ across the battery 59 is applied to the input terminal 2 of the circuit 1. In the same way as in the circuits I described hereinbefore with reference to FIGS. 1 to 6, the circuit 1 in the present case detects a level decrease of the input direct voltage, i.e. the charging voltage $U_L$, applied to the input terminal 2 of the circuit 1. A level decrease is detected for the reason that during charging of a battery 59 the charging process is or has to be ended if the charging voltage $U_L$ has reached a maximum value and then begins to decrease.

If the circuit 1 has detected a decrease in the level of the charging voltage $U_L$ it supplies value information WI in the form of a control signal having a high potential to the output terminal 13. This control signal at the output terminal is applied to the R input 77 of the flip-flop 66, as a result of which the flip-flop 66 is reset. This results in a low potential on the Q output 67, which is applied to the input 68 of the charging circuit 69, upon which the charging circuit 69 terminates the charging process.

When the switch 74 is set to its second switch position, the supply voltage U+ on the further input 75 of the switch 74 is applied to the output 76 of the switch 74, thereby enabling the level of the Supply voltage U+ to be determined by means of the circuit 1. Thus, it is possible not only to detect a level decrease of the charging voltage $U_L$ across the battery 59 but also level variations of the supply voltage U+. This is particularly advantageous because the level of the charging voltage $U_L$ or its decrease in level can then be determined particularly accurately, thus enabling a change in level of the supply voltage U+, which results in a change in the level of the charging voltage $U_L$ to be detected by means of the circuit 1, to be taken into account in determining the level or the decrease in level of the charging voltage $U_L$.

Figure 8:
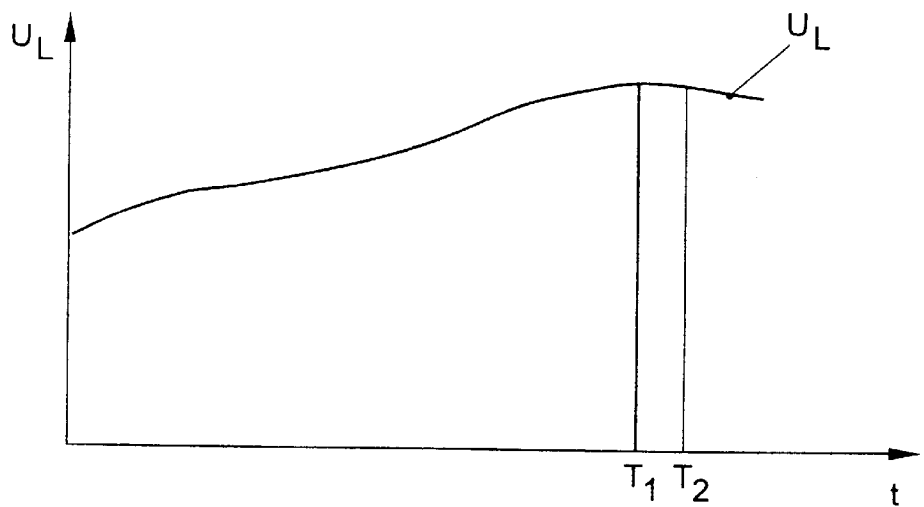
FIG. 8 represents a charging voltage across a battery charged by means of the circuit arrangement in accordance with FIG. 7.

As already stated, FIG. 8 shows a charging voltage $U_L$ across a battery 59 during a charging process. As can be seen, the charging voltage $U_L$ increases substantially continuously from the beginning of the charging process, until the battery 59 has been charged to approximately 100% at an instant $T_1$. Further charging of the battery 59 after the instant $T_1$ reduces the life of the battery 59 and should therefore absolutely be avoided. It is a well-known fact that the charging voltage $U_L$ across a battery 59 decreases slightly when charging of the battery 59 which has been charged to approximately 100% is continued. This decrease of the level of the charging voltage $U_L$ is detected by means of the circuit 1, as a result of which the charging process of the battery 59 is stopped at turn-off instant $T_2$ indicated in FIG. 8. The particularly accurate detection of the decrease in level of the charging voltage $U_L$ by the circuit I ensures that overcharging of the battery 59 is precluded.

In a circuit arrangement-as shown in FIG. 7 it may also be desired or required not to ground the terminal 72 but to keep it at a potential which can vary relative to ground. In such a case the terminal 71 and the terminal 72 are successively connected to the input terminal 2 of the circuit 1 in the time intervals $T_M$ and the level values then occurring between the terminal 72 and ground and between the terminal 71 and ground are detected and the value of the level of the charging voltage $U_L$ across a battery 59 is determined by forming the difference between said two level values, thus enabling a decrease in the level of the charging voltage $U_L$ to be detected by comparing successively detected values of the level of the charging voltage $U_L$.

I claim:

1. A circuit for detecting a level or a level variation of an input direct voltage, comprising:

an input terminal, to which the input direct voltage can be applied, a comparator having a first input, a second input and an output, which first input is connected to the input terminal, which second input is arranged to receive a reference signal, and on which output a comparator signal is available, a control information generation device by means of which control information corresponding to the comparator signal of the comparator can be generated, a controllable pulse generator for generating pulses having charge quantities, which pulses are available on an output of the pulse generator and which are variable with respect to their charge quantity by means of said control information which is applied to the pulse generator, and, an integrator having an input connected to the output of the pulse generator and having an output connected to the second input of the comparator and provided to form the reference signal, the reference signal having a d.c. component corresponding to the instantaneous charge quantity of the pulses of the pulse generator, and having an a.c. component superposed on the d.c. component;

characterized in that the integrator is adapted to form a reference signal in which the frequency of the a.c. component corresponds to the frequency of the pulses of the pulse generator, the comparator has its output connected to a detection device by means of which the presence of a comparator direct voltage and the presence of comparator pulses can be detected and by means of which the control information generation device can be controlled in such a manner that, upon a detection of the presence of a comparator direct voltage, the control information for the pulse generator can be generated, and, after a detection of the occurrence of comparator pulses, the generation of control information for the pulse generator can be terminated, and, the comparator further has its output connected to a time measuring device by means of which, after termination of the generation of the control information for the pulse generator, time information about the duration of the comparator pulses or the comparator pulse spacings can be derived, and, the circuit further comprises a logic device which detects a level or a level variation of the input direct voltage in dependence upon the charge quantity of the pulses of the pulse generator, and said time information.

2. A circuit as claimed in claim 1, characterized in that the integrator is adapted to form a reference signal whose a.c. component is a sawtooth signal superposed on the d.c. component of the reference signal.

3. A circuit as claimed in claim 1, characterized in that the detection device and the time measuring device are implemented by means of a single counting device.

4. A circuit as claimed in claim 1, characterized in that the detection device and the control information generation device and the pulse generator and the time measuring device and the logic device are implemented by means of a microcomputer.

5. A circuit as claimed in claim 1, characterized in that the circuit forms part of a circuit arrangement for charging at least one rechargeable battery and in this circuit arrangement serves to detect a level or a level variation of the charging voltage appearing across the battery during a charging process.

6. A circuit as claimed in claim 5, characterized in that in the circuit arrangement for charging it serves to detect a decrease in level of the charging voltage.

7. A circuit as claimed in claim 2, characterized in that the detection device and the time measuring device are implemented by means of a single counting device.

8. A circuit as claimed in claim 2, characterized in that the detection device and the control information generation device and the pulse generator and the time measuring device and the logic device are implemented by means of a microcomputer.

9. A circuit as claimed in claim 3, characterized in that the detection device and the control information generation device and the pulse generator and the time measuring device and the logic device are implemented by means of a microcomputer.

10. A circuit as claimed in claim 7, characterized in that the detection device and the control information generation device and the pulse generator and the time measuring device and the logic device are implemented by means of a microcomputer.

11. A circuit as claimed in claim 2, characterized in that the circuit forms part of a circuit arrangement for charging at least one rechargeable battery and in this circuit arrangement serves to detect a level or a level variation of the charging voltage appearing across the battery during a charging process.

12. A circuit as claimed in claim 3, characterized in that the circuit forms part of a circuit arrangement for charging at least one rechargeable battery and in this circuit arrangement serves to detect a level or a level variation of the charging voltage appearing across the battery during a charging process.

13. A circuit as claimed in claim 4, characterized in that the circuit forms part of a circuit arrangement for charging at least one rechargeable battery and in this circuit arrangement serves to detect a level or a level variation of the charging voltage appearing across the battery during a charging process.

14. A circuit as claimed in claim 7, characterized in that the circuit forms part of a circuit arrangement for charging at least one rechargeable battery and in this circuit arrangement serves to detect a level or a level variation of the charging voltage appearing across the battery during a charging process.

15. A circuit as claimed in claim 8, characterized in that the circuit forms part of a circuit arrangement for charging at least one rechargeable battery and in this circuit arrangement serves to detect a level or a level variation of the charging voltage appearing across the battery during a charging process.

16. A circuit as claimed in claim 9, characterized in that the circuit forms part of a circuit arrangement for charging at least one rechargeable battery and in this circuit arrangement serves to detect a level or a level variation of the charging voltage appearing across the battery during a charging process.

17. A circuit as claimed in claim 10, characterized in that the circuit forms part of a circuit arrangement for charging at least one rechargeable battery and in this circuit arrangement serves to detect a level or a level variation of the charging voltage appearing across the battery during a charging process.

18. A circuit as claimed in claim 4, characterized in that in the circuit arrangement for charging it serves to detect a decrease in level of the charging voltage.

19. A circuit as claimed in claim 11, characterized in that in the circuit arrangement for charging it serves to detect a decrease in level of the charging voltage.

20. A circuit as claimed in claim 17, characterized in that in the circuit arrangement for charging it serves to detect a decrease in level of the charging voltage.

* * * * *